United States Patent
Foust et al.

(10) Patent No.: US 8,053,260 B2
(45) Date of Patent: Nov. 8, 2011

(54) LARGE-AREA LIGHTING SYSTEMS AND METHODS OF MAKING THE SAME

(75) Inventors: Donald Franklin Foust, Glenville, NY (US); Larry Gene Turner, Rexford, NY (US); Ernest Wayne Balch, Ballston Spa, NY (US); Hak Fei Poon, Niskayuna, NY (US); William Francis Nealon, Gloversville, NY (US); Jie Liu, Niskayuna, NY (US); Tami Janene Faircloth, Santa Barbara, CA (US)

(73) Assignee: General Electric Company, Schenectady, NY (US)

( * ) Notice: Subject to any disclaimer, the term of this patent is extended or adjusted under 35 U.S.C. 154(b) by 1341 days.

(21) Appl. No.: 11/601,538

(22) Filed: Nov. 17, 2006

(65) Prior Publication Data

US 2008/0116815 A1 May 22, 2008

(51) Int. Cl.
 *H01L 21/00* (2006.01)
(52) U.S. Cl. ............... 438/28; 438/29; 438/34
(58) Field of Classification Search .......... 438/28, 438/29, 34
See application file for complete search history.

(56) References Cited

U.S. PATENT DOCUMENTS

| 7,049,757 | B2 | 5/2006 | Foust et al. | |
| 2004/0021425 | A1 | 2/2004 | Foust et al. | |
| 2004/0032220 | A1* | 2/2004 | Cok et al. | 315/291 |
| 2005/0272263 | A1* | 12/2005 | Brabec et al. | 438/689 |

FOREIGN PATENT DOCUMENTS

| EP | 1 396 676 A | 3/2004 |
| EP | 1396676 A2 | 3/2004 |
| EP | 1 460 884 A | 9/2004 |
| EP | 1 596 446 A | 11/2005 |
| EP | 1596446 A2 | 11/2005 |

OTHER PUBLICATIONS

State Intellectual Property Office, P.R. China, Unofficial English Translation of First Office Action issued on Mar. 10, 2011, 7 pages.

* cited by examiner

*Primary Examiner* — Kenneth Parker
*Assistant Examiner* — Anthony Ho
(74) *Attorney, Agent, or Firm* — Fletcher Yoder

(57) ABSTRACT

Large-Area lighting systems and methods of making the same. More specifically, groups of organic light emitting modules, such as organic light emitting diode modules, coupled in series with respect to on another are provided. The modules cathode of each organic light emitting module is electrically coupled to the anode of an adjacent light emitting module in an interconnect region. A portion of the cathode of each module extends adjacent to an active area of an adjacent module at an interconnect region. Methods of fabricating series groups of organic light emitting modules employing continuous material layers is also provided.

11 Claims, 5 Drawing Sheets

LARGE-AREA LIGHTING SYSTEMS AND METHODS OF MAKING THE SAME

STATEMENT REGARDING FEDERALLY SPONSORED RESEARCH AND DEVELOPMENT

The United States Government may have certain rights in this invention pursuant to contract number 70NANB3H3030 awarded by the National Institute of Standards & Technology (NIST).

BACKGROUND

The present invention relates generally to large area lighting systems, and more particularly to a series connected large area organic light emitting devices.

Organic electroluminescent devices, such as organic light emitting diodes (OLEDs), may be used in a number of applications, including display applications, signage applications and general lighting applications. An OLED device includes one or more organic light emitting layers ("active layers") disposed between two electrodes, e.g., a cathode and a light transmissive anode, formed on a light transmissive substrate. The active layer(s) emits light upon application of a voltage across the anode and cathode. More specifically, upon application of a voltage from a voltage source, electrons are directly injected into the active organic layer from the cathode, and holes are directly injected into the organic layer from the anode. The electrons and the holes travel through the active organic layer until they recombine at a luminescent center. This recombination process results in the emission of a photon, i.e., light.

Large area OLED devices typically combine many individual OLED devices on a single substrate or a combination of substrates with multiple individual OLED devices on each substrate. Groups of OLED devices are typically coupled in series and/or parallel to create an array of OLED devices which may be employed in display, signage or lighting applications, for instance. For these large area applications, it is desirable to create large light emitting areas in the array while minimizing the areas that do not produce light. Limitations in fabrication technology, as well as issues relating to the interconnection of the OLED devices in the array, provide a number of design challenges.

It is desirable to have a fabrication method, which enables the fabrication of low cost and highly efficient large-area devices.

BRIEF DESCRIPTION

In accordance with one embodiment of the present invention, there is provided a method of fabricating a series group of organic light emitting modules. The method comprises disposing a first electrode layer. The method further comprises patterning the first electrode layer to form at least one row of first electrode elements, wherein the at least one row of first electrode elements comprises an active area and an interconnect area formed along one side of the active area. The method further comprises disposing an active polymer layer on the at least one row of first electrode elements. The method further comprises etching a contact opening through the active polymer layer such that the contact opening exposes the interconnect area of the at least one row of first electrode elements. The method further comprises disposing a second electrode layer on the active polymer layer and through the contact opening such that the second electrode layer is coupled to the row of first electrode elements through the contact opening. The method further comprises patterning the second electrode layer to form at least one row of second electrode elements, wherein the at least one row of second electrode elements comprises an active area and an interconnect area formed over the interconnect area of the at least one row of first electrode elements. The method further comprises forming cut lines through each of the at least one row of second electrode elements, the active polymer layer and the at least one row of first electrode elements to define a plurality of organic light emitting modules, wherein each of the plurality of organic light emitting modules comprises an individual first electrode element formed by the cut lines through the at least one row of first electrode elements, and further comprises an individual second electrode element formed by the cut lines through the at least one row of second electrode elements, wherein the individual first electrode elements are electrically coupled to respective individual second electrode elements of adjacent organic light emitting modules through the contact opening.

In accordance with another embodiment of the present invention, there is provided a method of fabricating a series group of organic light emitting modules. The method comprises disposing a first electrode layer in a pattern to form at least one row of first electrode elements, wherein the at least one row of first electrode elements comprises an active area and an interconnect area formed along one side of the active area. The method further comprises disposing an active polymer layer on the at least one row of first electrode elements in a pattern to form a contact opening through the active polymer layer such that the contact opening exposes the interconnect area of the at least one row of first electrode elements. The method further comprises disposing a second electrode layer on the active polymer layer and through the contact opening such that the second electrode layer is coupled to the row of first electrode elements through the contact opening, whrein the second electrode layer is disposed in a pattern to form at least one row of second electrode elements, wherein the at least one row of second electrode elements comprises an active area and an interconnect area formed over the interconnect area of the at least one row of first electrode elements. The method further comprises forming cut lines through each of the at least one row of second electrode elements, the active polymer layer and the at least one row of first electrode elements to define a plurality of organic light emitting modules, wherein each of the plurality of organic light emitting modules comprises an individual first electrode element formed by the cut lines through the at least one row of first electrode elements, and further comprises an individual second electrode element formed by the cut lines through the at least one row of second electrode elements, wherein the individual first electrode elements are electrically coupled to respective individual second electrode elements of adjacent organic light emitting modules through the contact opening.

In accordance with another embodiment of the present invention, there is provided a series group of organic light emitting modules. The series group of organic light emitting modules comprises a first organic light emitting module comprising a first anode, a first cathode and an active polymer layer disposed between the first anode and the first cathode. The series group further comprises a second organic light emitting module comprising a second anode, a second cathode, and an active polymer layer disposed between the second anode and the second cathode, wherein the first organic light emitting module is directly adjacent to the second organic light emitting module and separated therefrom by a distance of less than 50 microns, and wherein the first cathode is electrically coupled to the second anode.

In accordance with yet another embodiment of the present invention, there is provided a series group of organic light emitting modules. The series group of organic light emitting modules comprises a first organic light emitting module comprising a first anode and a first cathode electrically isolated from one another. The series group further comprises a second organic light emitting module comprising a second anode and a second cathode electrically isolated from one another, wherein each of the first and second anodes and first and second cathodes of the first and second organic light emitting modules comprises an active light emitting area and an interconnect area, and wherein the active area of the first organic light emitting module is adjacent to the active area of the second organic light emitting area relative to a first direction, and wherein the interconnect area of the first cathode is adjacent to the active area of the second organic light emitting module relative to a second direction which is different from the first direction.

DRAWINGS

These and other features, aspects, and advantages of embodiments of the present invention will become better understood when the following detailed description is read with reference to the accompanying drawings in which like characters represent like parts throughout the drawings, wherein.

DETAILED DESCRIPTION

Figure 1:
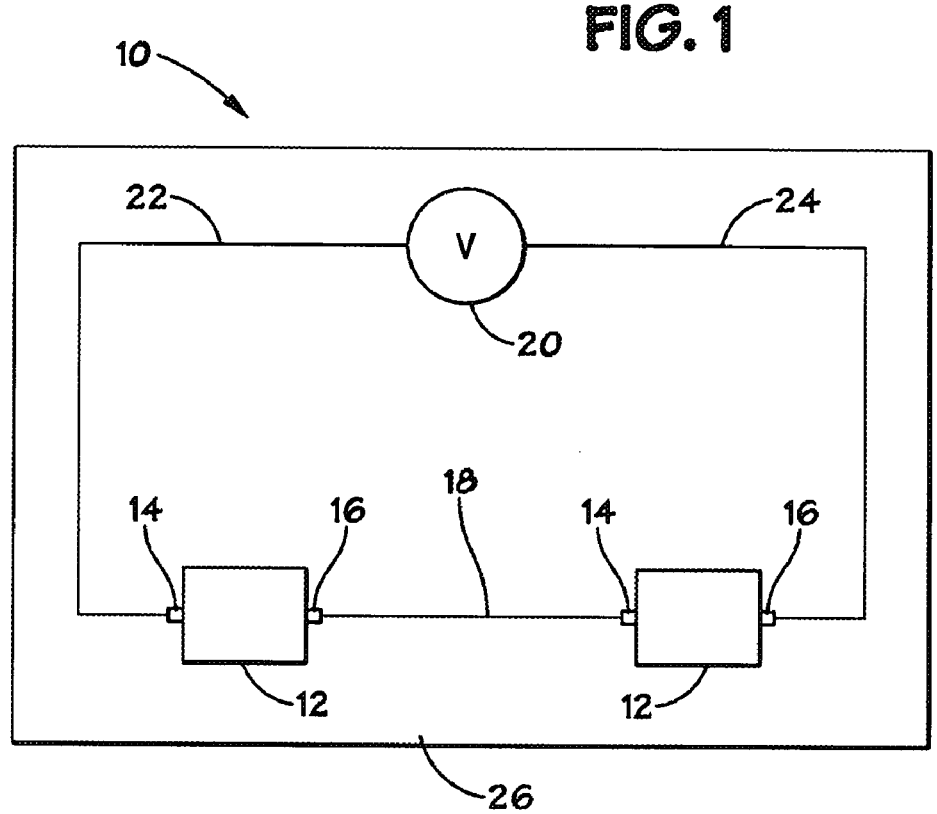
FIG. 1 is a schematic block diagram of a light emitting device that may be fabricated in accordance with embodiments of the present invention.

FIG. 1 illustrates a schematic diagram of an exemplary light emitting device which may be fabricated in accordance with one embodiment of the present invention. The light emitting device 10 includes a plurality of organic light emitting modules 12, such as organic light emitting diode (OLED) modules 12. FIG. 1 illustrates two OLED modules 12. Alternatively, there may be more that two OLED modules 12, as will be described in greater detail below. The OLED modules 12 are arranged such that they are electrically connected in series with one another. Further, as will be appreciated, while the organic light emitting modules 12 described in the specification are described as organic light emitting diode (OLED) modules 12, those skilled in the art will appreciate that the organic light emitting modules 12, described herein, may refer to other types of non-diode light emitting modules. For instance, the light emitting modules 12 may comprise light emitting electrochemical cells. As will be appreciated, both types of devices generate light upon application of a bias. The main difference between the devices is the shape of their respective current-voltage (IV) curves, as well as operation modes. Light-emitting diodes exhibit a rectified IV curve, because current under forward bias is much higher than the current under reverse bias, and thus, diode-based devices are operated under a DC mode. By contrast, light-emitting electrochemical cells do not have the rectification effects and can be operated under both DC and AC modes. For simplicity and by way of non-limiting example, the light emitting modules 12 are described in further detail throughout the present specification as being OLED modules 12.

Each of the individual OLED modules 12 has an anode 14 and a cathode 16. The OLED modules 12 are electrically connected in a series arrangement, anode 14 to cathode 16, as shown in FIG. 1. In this regard, the respective anodes and cathodes are typically electrically connected via interconnect wiring 18.

The light emitting device 10 also includes a power source 20 to provide a voltage to the OLED modules 12. The power source 20 provides power to the plurality of OLED modules 12 via first conducting line 22 and second conducting line 24. The conducting lines 22 and 24, are electrically connected to a respective end anode 14 and respective end cathode 16 of the plurality of OLED modules 12. In one embodiment of the present invention, the power source 20 is a DC power source. In another embodiment of the present invention, the power source 20 is an AC power source.

In the present exemplary embodiment, at least two OLED modules 12 are connected in series to form a group of OLED modules 12. The OLED modules 12 on each end of the series group are electrically connected to only one other OLED module 12. In this case, the conducting lines 22 and 24 are respectively connected with the anode 14 and cathode 16 of the respective OLED modules disposed on the ends of the series. Thus, the power source 20 provides a voltage to each of the OLED modules 12 of the plurality of OLED modules 12.

The power source 20 and the plurality of OLED modules 12 are shown in FIG. 1 as arranged on a substrate 26. However, the plurality of OLED modules 12 and the power source 20 need not be arranged on a single substrate. In fact, neither the plurality of OLED modules 12 nor the power source 20 need be arranged on the substrate 26.

While FIG. 1 shows a light emitting device 10 with only a single group of OLED modules 12 arranged in a series configuration, the light emitting device 10 may include more than one group of OLED modules 12. Each of the OLED modules 12 of each group is arranged in a series configuration such that adjacent modules in a group are electrically coupled in series. Further, each group may be electrically connected to other groups in a parallel configuration, as described further below.

Figure 2:
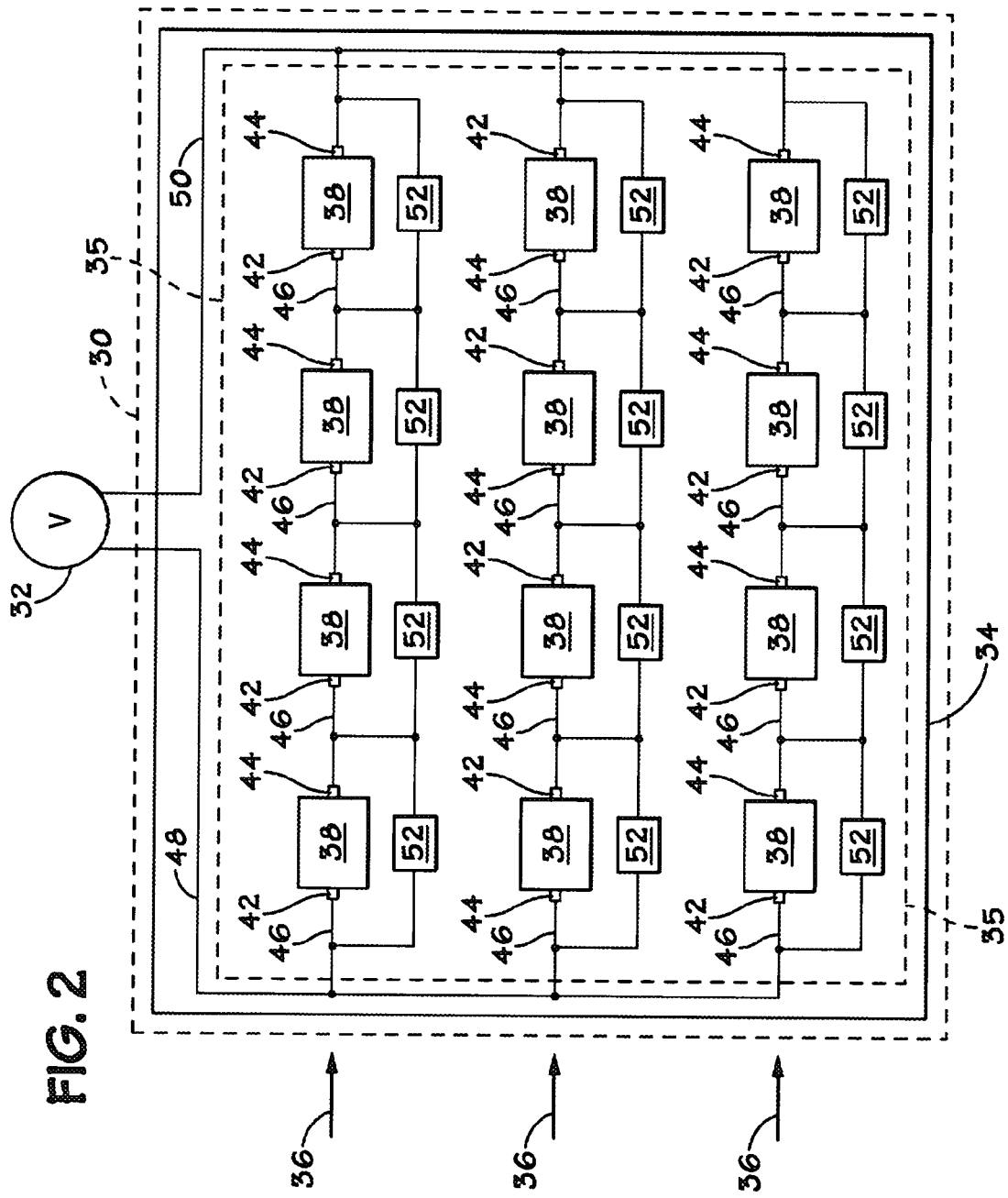
FIG. 2 is a schematic block diagram of a light emitting device that may be fabricated in accordance with embodiments of the present invention.

FIG. 2 illustrates an exemplary embodiment of a light emitting device 30 that may be fabricated in accordance with the presently described techniques. The light emitting device 30 of the embodiment illustrated in FIG. 2 is connected to a power source 32. The light emitting device 30 includes a substrate 34 and a plurality of OLED series groups 36, represented collectively by reference numeral 35, provided on the substrate 34. In the illustrated embodiment, the light emitting device 30 includes three series groups 36. In one embodiment of the present invention, the substrate 34 is comprises a transparent glass.

In one embodiment of the present invention, the power source 32 is a DC power source. In another embodiment of the present invention, the power source 20 is an AC power source.

Each of the OLED series groups 36 comprises a plurality of individual OLED modules 38. When a voltage is provided from the power source 32 to the OLED modules 38, the OLED modules 38 emit light.

As with the exemplary embodiment illustrated in FIG. 1, each of the OLED modules 38 in the present exemplary embodiment includes an anode 42 and a cathode 44. The OLED modules 38 of a particular series group are electrically connected in series, i.e., an anode 42 of one OLED module 38 to a cathode 44 of an adjacent OLED module 38. As with the embodiment illustrated in FIG. 1, in the present embodiment the respective anodes 42 and cathodes 44 of the OLED modules 38 electrically connected in series are typically connected via interconnect wiring 46.

In one embodiment of the present invention, power is provided to the series groups 36 and thus the individual OLED modules 38 from the power source 32 via a first conducting line 48 and a second conducting line 50. The first conducting line 48 is electrically connected to a first end of each OLED series group 36. The second conducting line 50 is electrically connected to a second end of each OLED series group 36 opposite the first end. The first end and second end of each OLED series group 36 are opposite to each other in the sense of having opposite polarity, i.e., one of the ends is electrically connected to the cathode 44 and the other end is electrically connected to an anode 42. The first end and second end need not be opposite to each other in a spatial sense, i.e., the first end and second end need not correspond to the OLED modules 38 that are physically the furthest apart.

FIG. 2 shows the power source 32 as being separate from the light emitting device 30. In another embodiment of the present invention, the power source 32 is included in the light emitting device 30.

In another embodiment of the present invention, the light emitting device 30 further comprises a plurality of circuit elements 52. Each circuit element 52 is electrically connected in parallel with a respective OLED module 38. For illustrative purposes, FIG. 2 shows each of the circuit elements 52 in parallel with a single OLED module 38. In another embodiment of the present invention, a particular circuit element 52 is in parallel with more than one OLED module 38. Further, the circuit elements 52 may or may not be included in the light emitting device 30.

In one embodiment of the present invention, the circuit elements 52 may include resistors, diodes, varistors, and combinations thereof. The circuit element 52 functions to modify the voltage across its respective OLED module 38. In another embodiment of the present invention, the circuit element 52 reduces the voltage across its respective OLED module 38 to provide a proper operating voltage for the OLED module 38. In another embodiment of the present invention, the circuit element 52 functions to provide fault tolerance for its respective OLED module 38.

In another embodiment of the present invention, the series groups 36 of the light emitting device 30 are arranged such that the ends of the series groups 36 that are connected to the first conducting line 48 have alternating polarity as shown in FIG. 2. In this embodiment, the first conducting line 48 is electrically connected to one series group via the cathode 44 of the OLED module 38 of that series group 36, and the next series group 36 is electrically connected to the first conducting line 48 via an anode 42 of the OLED module 38 of that next series group 36. Likewise, the second conducting line 50 is connected to the end of the series group 36 having alternating polarity. In one embodiment of the present invention, DC power is supplied to the voltage supply 32 and the first conducting line 48 is connected to the positive side of the voltage supply 32, and the second conducting line 50 is connected to the negative side of the voltage supply 32, then the OLED series group 36 disposed in between the other OLED series groups 36 does not illuminate. In another embodiment of the present invention, DC power is supplied to the voltage supply 32 and the first conducting line 48 is connected to the negative side of the voltage supply 32, and the second conducting line 50 is connected to the positive side of the voltage supply 32, then the OLED series groups 36 disposed above and below the OLED series group 36 disposed in the middle do not illuminate.

When AC power is provided to the light emitting device 30, and the series groups 36 are arranged to be connected with alternating polarity, the fraction of the series groups 36 connected with one polarity emits light during one half-cycle of the AC waveform. During the other half-cycle, the remaining series groups 36 connected with the opposite polarity emits light. Thus, the light emitted during both half-cycles of the AC waveform has temporal uniformity.

When using AC power and it is desired that the light emitted during both half cycles be of the same overall intensity, then one-half of the OLED modules 38 of the series groups 36 are connected with one polarity and one-half of the OLED modules 38 of the series groups 36 are connected with the other polarity. When using AC power in an application that does not require that the light emitted during alternating half-cycles have a uniform temporal intensity, then the fraction of OLED modules 38 connected with one polarity need not be the same as the fraction connected with the opposite polarity. In another embodiment of the present invention, the OLED modules 38 are connected with the same polarity.

FIG. 2 illustrates an embodiment of the present invention where the series groups 36 that are immediately adjacent to one another are connected to have opposite polarity. The light emitting device in this arrangement emits light with a uniform spatial intensity. In another embodiment of the present invention, the series groups 36 are be arranged such that immediately adjacent series groups have the same polarity.

FIG. 2 illustrates each of the series groups 36 comprising a row of OLED modules 38 where the OLED modules in the group are arranged in a straight line. In another embodiment of the present invention, the series groups 36 comprise a group of OLED modules 38 arranged in a configuration other than a straight line. In this embodiment, the group of OLED modules 38 corresponding to a particular series groups 36 are arranged in more than one straight line of OLED modules 38. In another embodiment of the present invention (not shown in FIG. 2), the group of OLED modules 38 corresponding to a particular series group 36 are arranged so that only a fraction of the OLED modules 38 are in one particular line.

FIG. 2 illustrates each of the series groups 36 having four OLED modules 38. However, the number of OLED modules 38 is not limited to four, and the actual number of OLED modules 38 may vary depending on the application. The number of OLED modules 38 will depend upon the maximum desired voltage for an OLED module 38, and upon the maximum voltage provided by the power source 32 at the peak of the AC voltage waveform used in operation. For example, when a 120V source 32 is employed and each OLED module 38 has an identical current/voltage characteristic with a maximum desired voltage of 10V, then twelve OLED modules 38 are connected in series. Alternatively, if circuit elements 52 are employed to reduce the voltage to respective OLED modules 38 by one-third, eight OLED modules 38 are employed in each series group 36. In this case, the circuit elements 52 are disposed in series with the OLED modules 38.

Figure 3:
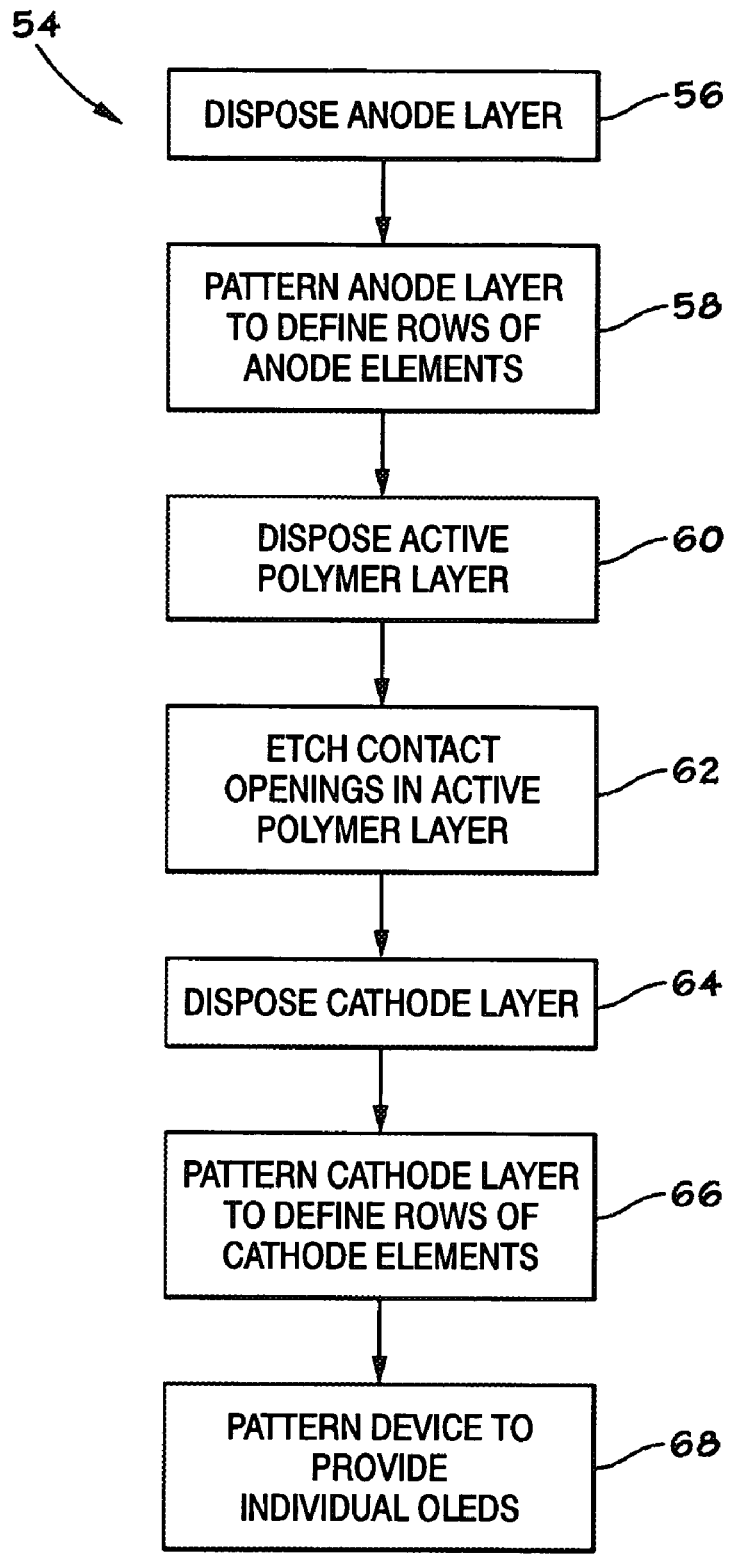
FIG. 3 is a flow chart describing a method of fabricating light emitting devices in accordance with embodiments of the present invention.

Turning now to FIG. 3, a flow chart illustrating an exemplary method of fabricating a series group 36 is provided and generally designated by reference numeral 54. As will be appreciated, manufacturability is often a factor in determining which processes to employ in fabricating a device. As will be appreciated, from a manufacturability standpoint, the cheaper and easier it is to manufacture a robust device, the better. The presently described method 54 provides a technique for fabricating the light emitting device 30, and more particularly, a light emitting device having a plurality of OLED modules 38 coupled in series to form series groups 36. The process 54 illustrated in FIG. 3 may be better understood by referring to FIGS. 4-7, which illustrate the steps described in FIG. 3. Accordingly, the following discussion of the steps of FIG. 3 will be supplemented with a concurrent discussion of FIGS. 4-7.

Before turning to the specific steps described in the method 54 of FIG. 3, it should be understood that the deposition and patterning steps for each of the layers of the OLED modules 38 are illustrated in the flow chart as employing non-selective deposition techniques. That is, each layer (e.g., anode, active polymer and cathode) is deposited as a continuous layer that is subsequently patterned by a selective removal method. Accordingly, the deposition and patterning of each layer is indicated by respective blocks. However, as will be appreciated, selective deposition techniques may be employed, wherein one or more of the layers are deposited to produce a pattern, thereby eliminating the need for a separate subsequent patterning step.

Referring initially to FIG. 3, in the first step of the process 54, a first electrode layer, here an anode layer, is disposed on a substrate, as indicated in block 56. As will be appreciated, the anode layer may comprise any suitable material that is transparent so that light emitted from the active layers in between the electrodes may propagate out of the OLED modules 38 to provide illumination. More specifically, the anode layer may comprise any suitable transparent conductive oxide (TCO), such as indium tin oxide (ITO) or tin oxide, or may any suitable transparent metal, such as nickel or gold, for example. The material forming the anode layer may be disposed by conventional vapor deposition techniques, such as evaporation or sputtering, for example, or may be disposed using roll techniques, such as micro-gravure coating, forward or reverse roll coating, direct forward gravure coating, offset gravure, flexographic printing, screen printing or inkjet printing, for example. Regardless of the technique used to dispose the anode layer, it should be noted that the anode layer is disposed onto a substrate or fabrication surface as a single continuous layer, in accordance with embodiments of the present invention.

Once the continuous anode layer is disposed, it is patterned to define rows of anode elements, as indicated in block 58. In one exemplary embodiment, each defined row may be patterned to define the respective anode of each of the OLED modules 38 in a series group 36. By way of example, referring briefly to FIG. 2, each of the three series groups 36 may be fabricated simultaneously on a substrate or fabrication surface. In accordance with block 56 of FIG. 3, a continuous anode layer may be disposed on a substrate. The anode layer will eventually be patterned to form the individual anodes of each of the OLED modules 38. At step 58 of FIG. 3, the anode layer is patterned such that the row of anode elements of each series group 36 (FIG. 2) is isolated with respect to one another.

Figure 4A:
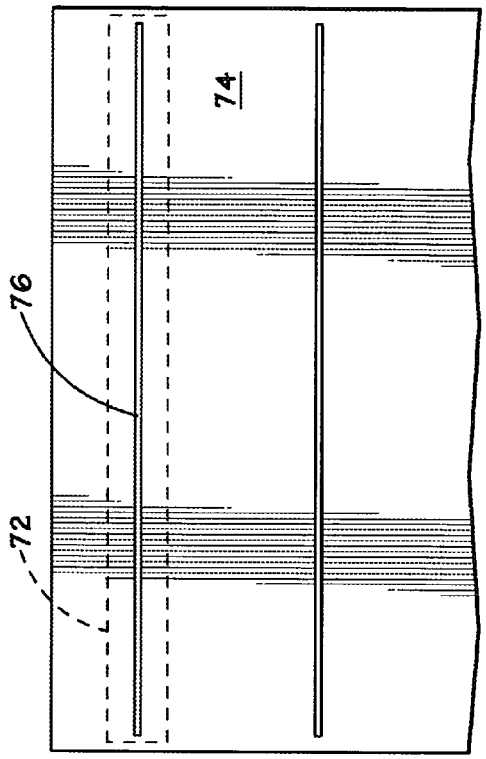
FIGS. 4A-4C illustrate a top view illustrating individual layers of a light emitting device fabricated in accordance with embodiments of the present invention.

FIG. 4A illustrates the patterning of the anode layer to define individual rows of anode elements 70 for a series group 36, as described in block 58 (FIG. 3). Specifically, FIG. 4A illustrates two rows of anode elements 70, which may eventually form the individual anodes of the OLED modules 38 of a series group 36. The continuous layer of anode material (e.g., ITO) may be patterned to provide the anode elements 70, wherein the excess anode material is removed from the underlying substrate or fabrication surface, as illustrated in FIG. 4A. Alternatively, laser ablation, scribing or embossing may be employed to simply isolate the rows of anode elements 70 from the continuous layer. As illustrated in FIG. 4A each anode element 70 is configured such that an interconnect area 72 is provided. As will be described further below, the interconnect area 72 is formed along one edge of the OLED devices and will provide the series connections between adjacent elements in the series group 36. As will be described with reference to FIGS. 5-7, the unique patterning of each layer (e.g., the anode layer) in the interconnect area 72 will facilitate the series interconnection of the adjacent elements. The interconnect area 72 of the row of anode elements 70 is arranged above the active area of what will eventually be each respective OLED module 38 in a series group 36. As will be described further below, the interconnect area for each OLED module 38 is coupled directly to and arranged adjacent the active area of the same respective OLED modules. That is, once the OLED modules 38 are completely disposed and patterned, the interconnect area 72 of each OLED module 38 will be adjacent the active area of the same OLED module 38. This configuration will be more fully described and illustrated with reference to FIGS. 5-7.

Returning to FIG. 3, after deposition and patterning of the anode layer, one or more active polymer layers are disposed over the patterned anode elements 70, as indicated in block 60. As can be appreciated, for an OLED device, the active polymer layer may comprise several layers of organic light-emitting polymers, such as a polyphenylene vinylene or a polyfluorene, typically from a xylene solution. The number of layers and the type of organic polymers disposed will vary depending on the application, as can be appreciated by those skilled in the art. The organic layer may be disposed at a thickness in the range of approximately 500-2500 Angstroms, for example. However, as can be appreciated, the thickness of the organic layer may vary, depending on the application. In one exemplary embodiment of an OLED device, the organic layer may comprise a conducting polymer such as poly(3,4)-ethylendioxythiophene/polystrene sulfonate (PEDOT/PSS) and a blue-light emitting polymer such as polyfluorene. To convert the blue-light to white light for use in area lighting, one or more conversion layers comprising organic molecules, such as perylene orange and perylene red, and inorganic phosphor particles, such as [Y(Gd)AG:Ce)], may be included. As can be appreciated, the blue-light to white-light conversion layers may be located outside of the OLED device, as separate layers, rather than being included in the active polymer layer. Various layers may be implemented in the active polymer layer or outside of the OLED device to provide light in a desired color. Certain colors may be easier and/or cheaper to produce in the active polymer layer based on the available materials and the processes for disposing the materials, as can be appreciated by those skilled in the art.

The active polymer layer may be one or more organic layers disposed by vapor deposition techniques, such as evaporation or sputtering, for example, or may be disposed using roll techniques, such as micro-gravure coating, forward or reverse roll coating, direct forward gravure coating, offset gravure, flexographic printing, screen printing or inkjet printing, for example. Regardless of the technique used to dispose the organic layers, it should be understood that each of the organic layers that form the active polymer layer are disposed directly over the patterned anode elements 70 as a single continuous layer.

Figure 4B:
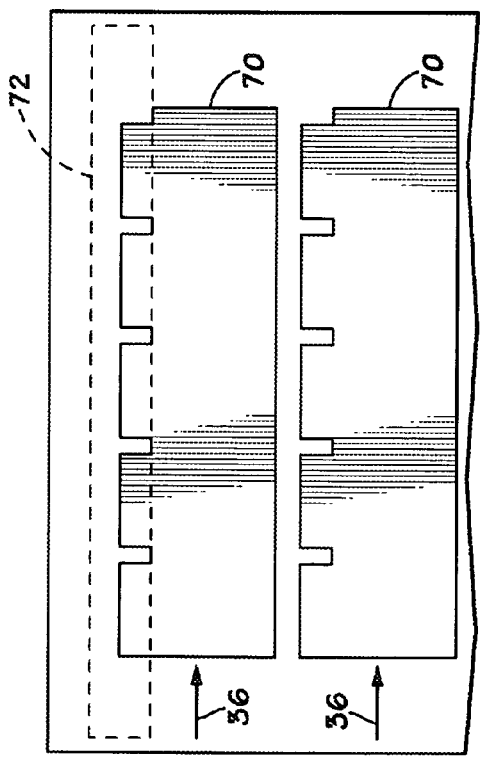

After deposition of the active polymer layer, contact openings are made in the active polymer layer, as indicated in block 62 of FIG. 3. FIG. 4B illustrates the active polymer layer 74 having contact openings 76 formed in the interconnect area 72. As will be described and illustrated in more detail below, the contact opening 76 is formed directly over the interconnect area 72 of the underlying rows of anode elements 70. The openings 76 provide thru-hole areas to facilitate electrical coupling of adjacent devices, once the cathode material is subsequently deposited. The contact openings 76 may be formed in the active polymer layer 74 by laser ablation or solvent assisted wiping (SAW), for example. The two contact openings 76 illustrated in FIG. 4B correspond to the two series groups 36 illustrated in FIG. 4A. As will be appreciated, a contact opening 76 may be formed for each series group 36, such that they align with the underlying interconnect area 72 of the rows of anode elements 70 (FIG. 4A).

After deposition of the active polymer layer 74 and the formation of the contact openings 76 therethrough, the cathode layer may be disposed directly onto the active polymer layer 74, as indicated in block 64 of FIG. 3. The cathode layer may comprise any suitable electrically conductive electrode material, such as aluminum. As with the anode layer and the active polymer layer, the cathode layer is disposed as a single continuous layer. The cathode layer may be disposed by conventional vapor deposition techniques, such as evaporation or sputtering, for example, or may be disposed using roll techniques, such as micro-gravure coating, forward or reverse roll coating, direct forward gravure coating, offset gravure, flexographic printing, screen printing or inkjet printing, for example.

Figure 4C:
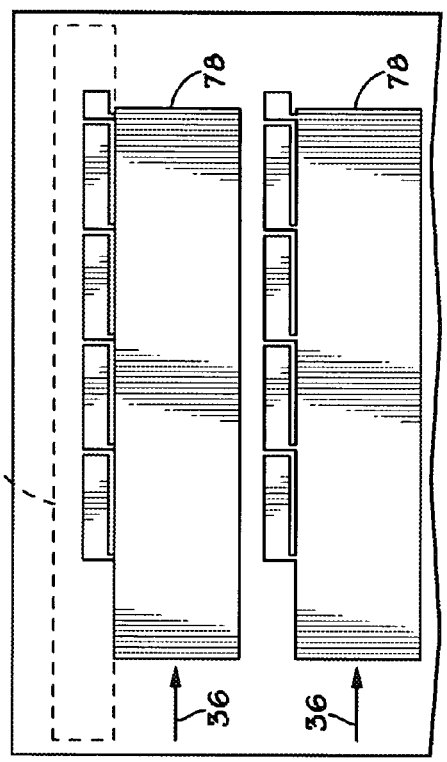

Once the cathode layer is disposed, the cathode layer is patterned to define rows of cathode elements 78, as indicated in block 66 of FIG. 3, and as illustrated in FIG. 4C. For illustrative purposes, FIG. 4C only depicts the layer of cathode elements 78. However, as will be understood, and as will be illustrated with regard to FIG. 5, the cathode layer is disposed directly on the active polymer layer 74. However, for clarity, the underlying layers have been omitted in FIG. 4C. As illustrated in FIG. 4C, after deposition of the cathode material as a continuous layer, the cathode material is patterned, such that rows of cathode elements 78, corresponding to respective series groups 36, are formed. The cathode material is patterned such that each row of cathode elements 78 comprises an interconnect area 72 along one edge of the series group of cathode elements 78. The cathode material may be patterned using laser ablation or scribing to produce the illustrated cathode elements 78. As depicted in FIG. 4C, and described further below with respect to FIGS. 5-7, the interconnect area 72 of what will eventually be an individual OLED module 38 is arranged directly adjacent to the active area of an adjacent OLED module 38, rather than adjacent the active area of the same OLED module 38. As will be understood, this configuration will allow for series interconnection between adjacent OLED modules 38 in a series group 36.

One additional layer in the OLED modules 38 that has not been illustrated is a cathode activator. As will be appreciated, the cathode activator enables the efficient injection of electrons into the OLED module 38. Typically these materials are active metals (Li, Na, K, Ca, Ba) or precursors to active metals (LiF, NaF, etc). As with the anode, active polymer layer and cathode, the deposition of the cathode activator may be selective or non-selective. The cathode activator is deposited after the deposition and patterning of the active polymer layer (blocks 60 and 62) and prior to deposition of the cathode layer (block 64). The cathode activator may be patterned such that it will match the pattern of the subsequently disposed and patterned cathode layer. According to one embodiment, the cathode activator and the cathode layer may be deposited by evaporation through a mask. The same mask may be employed for both depositions, though different masks may also be employed. While it may be convenient to pattern the cathode activator using the same mask as that used for the cathode layer, the cathode activator may be disposed/patterned such that no cathode activator is present in the interconnect area 72. As will be appreciated, the cathode activator may only be useful in the active, light producing regions of the OLED modules, and not in the regions used to make electrical connections between layers, between adjacent devices, and/or to external elements.

Figure 5:
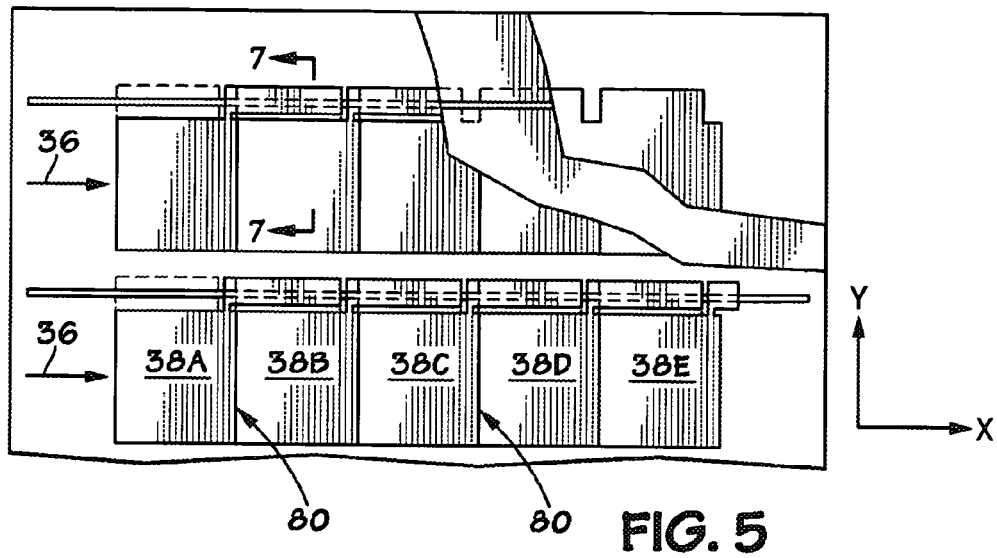
FIG. 5 is top view of a portion of a light emitting device after deposition of each of the layers in accordance with embodiments of the present invention.
Figure 6:
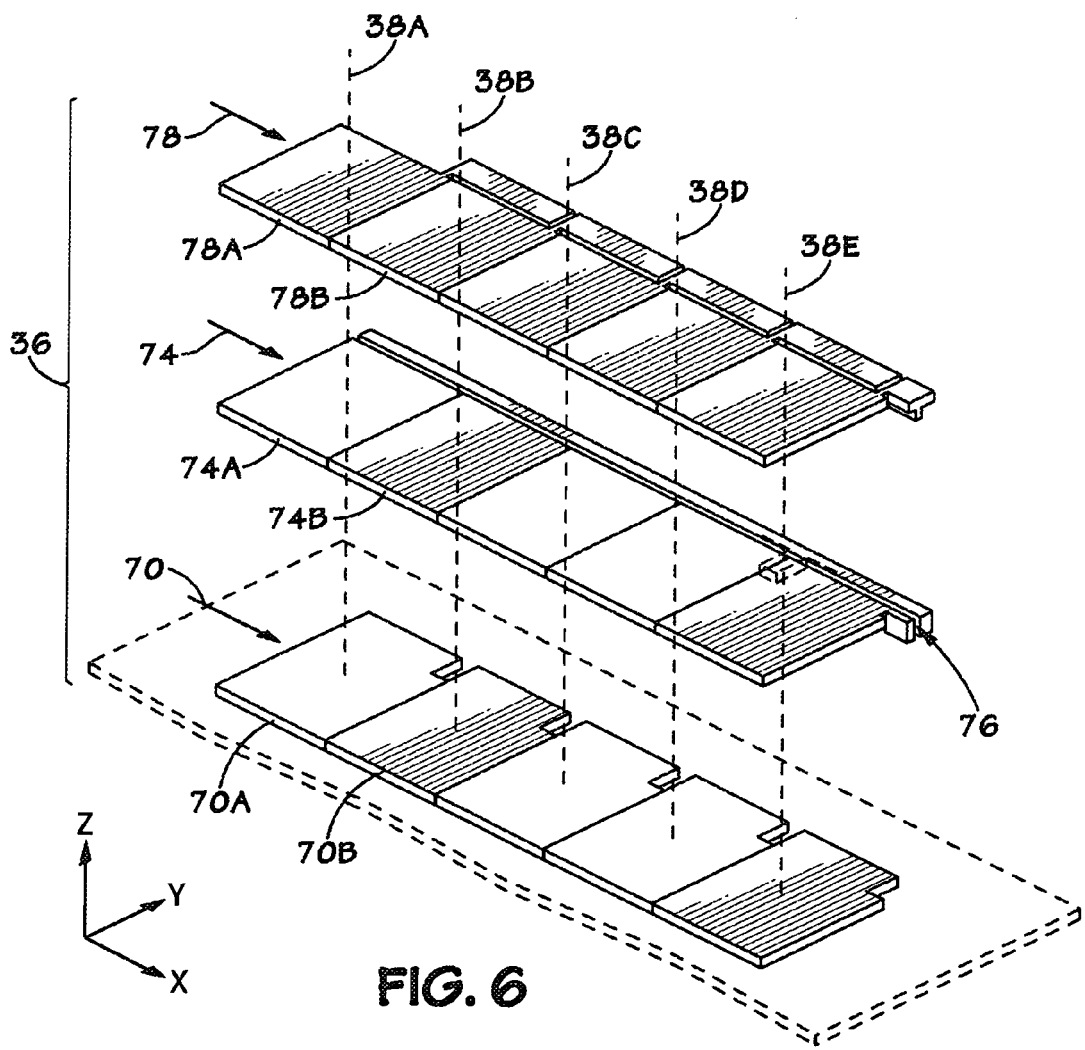
FIG. 6 is a perspective exploded view of the light emitting device in accordance with embodiments of the present invention.

Once the cathode material is disposed and patterned, the active area of the individual OLED modules 38 in a series group 36 may be separated by laser ablation, mechanical scribing or embossing, for instance, as indicated in block 68 of FIG. 3. As used herein, the "active area" of the OLED modules refer to the portion of the devices not designated as the "interconnect area 72." That is, the active area is employed for light production, while the interconnect area is employed to provide series interconnection between adjacent OLED modules. A partial breakaway view of the series groups 36 fabricated in accordance with the present embodiments is illustrated in FIG. 5. Further, an exploded view of the individual layers of the series group 36 is illustrated with reference to FIG. 6. As illustrated in FIGS. 5 and 6, the active area of each OLED module 38A-38E is separated from the active area of each adjacent OLED module 38A-38E in a series group 36 via a respective cut line 80. The cut line 80 is formed after each layer has been disposed and patterned. Advantageously, by electrically isolating the active areas of each adjacent OLED module 38A-38E from one another using laser ablation, for instance, the non-light emitting area between adjacent devices 38A-38E is relatively small. In accordance with one exemplary embodiment, the non-light emitting area between each of the OLED modules 38A-38E, created by the cut line 80, is less than 50 microns wide, for instance. As will be appreciated, providing a series group having minimal non-light emitting areas is advantageous for large area OLED applications such as general area lighting and signage applications.

As previously described, each series group 36 comprises a number of OLED modules 38A-38E which are coupled in series with respect to one another. More specifically, the cathode of one OLED module is electrically coupled to the anode of an adjacent OLED module through the contact opening 76 in the interconnect area 72. As illustrated in FIGS. 5 and 6, once the cut lines 80 are created through each of the layers, the active area of each OLED module 38A-38E is electrically separated from the active area of any adjacent modules 38A-38E. However, the interconnect area 72 provides an electrical path from a cathode of a respective OLED module to a respective anode of an adjacent OLED module. For instance, the cathode 78A of the OLED module 38A is electrically coupled to the anode 70B of the adjacent OLED module 38B, through the contact opening 76, as best illustrated in FIG. 6. As illustrated in the exploded view of FIG. 6, each cathode (e.g., 78A) has a portion that extends above the adjacent cathode (e.g., 78B) in the interconnect region 72 above the active region of each device. The extended portion of each cathode is electrically coupled to the underlying anode of an adjacent element through the contact opening 76 in the active polymer layer 74. For instance, the portion of the cathode 78A that extends above the active area of the cathode 78B in the interconnect region 72, is electrically coupled to the underlying anode 70B. Accordingly, the OLED device 38A is electrically coupled in series to the OLED device 38B.

For clarity, and as used herein, the portion of the respective cathodes (e.g., 78A) that extend above the anode (e.g., 70B) of the active area of the adjacent OLED module refers to the portion that is located above the active area of the adjacent OLED module in the y-direction, and in accordance with the orientation vane provided in FIGS. 5 and 6. In accordance with the assigned orientation, the "x-direction" refers to the direction in which that adjacent modules are formed. The "z-direction" refers to the direction of fabrication (i.e., the direction in which layers are deposited on top of one another). Thus, the modules that are said to be adjacent to one another are fabricated directly next to each other, and said to be located in the x-direction relative to one another. The portion of the cathode that extends above the active area of an adjacent module is located in the y-direction with reference to the active area of the adjacent module. As will be appreciated, the portion of the cathode that extends above (in the y-direction) the active area of an adjacent module is aligned with the underlying anode of that adjacent module in the z-direction. Unlike the interconnect area 72 of the anode region (described and illustrated in FIG. 4A), wherein the interconnect area 72 of the anode is coupled to and located directly adjacent to the active area of the same respective OLED module (in the y-direction), the interconnect area 72 of the cathode is fabricated above the active area of an adjacent OLED module (in the y-direction). Accordingly, series connection between adjacent modules is facilitated.

Figure 7:
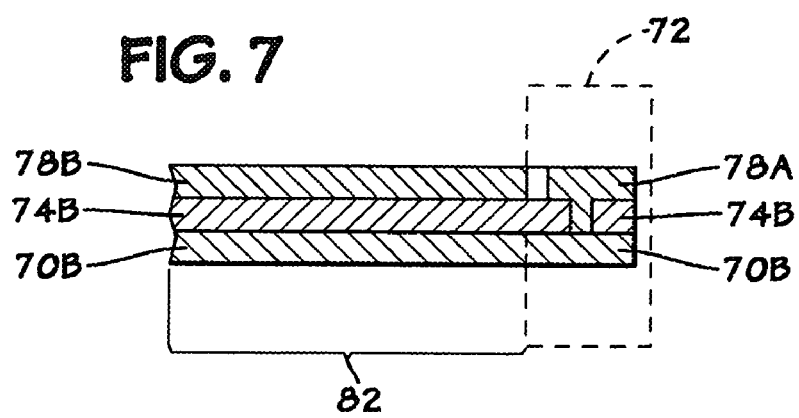
FIG. 7 is a cross section view of a portion of the light emitting device, taken along the cut lines 7-7 of FIG. 5.

Referring now to FIG. 7, a cross sectional view of a portion of an OLED module taken along the cut-lines 7-7 of FIG. 5 is illustrated. As illustrated in FIG. 7, the interconnect area 72 provides a series connection between the cathode 78A of the first OLED module 36A and the anode 70B of the adjacent OLED module 36B. The electrical coupling of the cathode 78A and the anode 70B is achieved through the contact opening 76 in the active polymer layer 74B. As will be appreciated, the active area 82 of the OLED module 36B includes the cathode 78B, active polymer layer 74B and anode 70B.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of fabricating a series group of organic light emitting modules, comprising:
   disposing a first electrode layer;
   patterning the first electrode layer to form at least one row of first electrode elements, wherein the at least one row of first electrode elements comprises an active area and an interconnect area formed along one side of the active area;
   disposing an active polymer layer on the at least one row of first electrode elements;
   etching a contact opening through the active polymer layer such that the contact opening exposes the interconnect area of the at least one row of first electrode elements;
   disposing a second electrode layer on the active polymer layer and through the contact opening such that the second electrode layer is coupled to the row of first electrode elements through the contact opening;
   patterning the second electrode layer to form at least one row of second electrode elements, wherein the at least one row of second electrode elements comprises an active area and an interconnect area formed over the interconnect area of the at least one row of first electrode elements; and
   forming cut lines through each of the at least one row of second electrode elements, the active polymer layer and the at least one row of first electrode elements to define a plurality of organic light emitting modules, wherein each of the plurality of organic light emitting modules comprises an individual first electrode element formed by the cut lines through the at least one row of first electrode elements, and further comprises an individual second electrode element formed by the cut lines through the at least one row of second electrode elements,
   wherein the individual first electrode elements are electrically coupled to respective individual second electrode elements of adjacent organic light emitting modules through the contact opening.

2. The method, as set forth in claim 1, wherein disposing the first electrode layer comprises disposing an anode layer and wherein disposing the second electrode layer comprises disposing a cathode layer.

3. The method, as set forth in claim 1, wherein disposing the first electrode layer comprises disposing a transparent conductive layer.

4. The method, as set forth in claim 1, wherein disposing the active polymer layer comprises disposing one or more organic light-emitting polymer layers.

5. The method, as set forth in claim 1, wherein disposing the first and second electrode layers comprises disposing a continuous first electrode layer and disposing a continuous second electrode layer.

6. The method, as set forth in claim 1, wherein disposing the active polymer layer comprises disposing a continuous active polymer layer.

7. The method, as set forth in claim 1, wherein forming the cut lines comprises defining the plurality of organic light emitting modules wherein the each of the individual first electrode elements comprises an interconnect area and an active area, and wherein the interconnect area of each respective first electrode element is directly adjacent to the active area of the first electrode element.

8. The method, as set forth in claim 1, wherein forming the cut lines comprises defining the plurality of organic light emitting modules wherein the each of the individual second electrode elements comprises an interconnect area and an active area, and wherein the interconnect area of each respective second electrode element is directly adjacent to the active area of the first electrode element of an adjacent organic light emitting module.

9. The method, as set forth in claim 1, wherein forming the cut lines comprises forming the cut lines via laser ablation, mechanical scribing or embossing.

10. The method, as set forth in claim 1, comprising disposing an activator layer on the active polymer layer, wherein the activator layer is configured to activate the second electrode layer.

11. A method of fabricating a series group of organic light emitting modules, comprising:
   disposing a first electrode layer in a pattern to form at least one row of first electrode elements, wherein the at least one row of first electrode elements comprises an active area and an interconnect area formed along one side of the active area;

disposing an active polymer layer on the at least one row of first electrode elements in a pattern to form a contact opening through the active polymer layer such that the contact opening exposes the interconnect area of the at least one row of first electrode elements;

disposing a second electrode layer on the active polymer layer and through the contact opening such that the second electrode layer is coupled to the row of first electrode elements through the contact opening, whrein the second electrode layer is disposed in a pattern to form at least one row of second electrode elements, wherein the at least one row of second electrode elements comprises an active area and an interconnect area formed over the interconnect area of the at least one row of first electrode elements; and forming cut lines through each of the at least one row of second electrode elements, the active polymer layer and the at least one row of first electrode elements to define a plurality of organic light emitting modules, wherein each of the plurality of organic light emitting modules comprises an individual first electrode element formed by the cut lines through the at least one row of first electrode elements, and further comprises an individual second electrode element formed by the cut lines through the at least one row of second electrode elements, wherein the individual first electrode elements are electrically coupled to respective individual second electrode elements of adjacent organic light emitting modules through the contact opening.

* * * * *